United States Patent
Abu-Lebdeh et al.

(10) Patent No.: US 6,715,023 B1
(45) Date of Patent: Mar. 30, 2004

(54) PCI BUS SWITCH ARCHITECTURE

(75) Inventors: Ziad M. Abu-Lebdeh, Milpitas, CA (US); Jeffrey R. Fox, Los Gatos, CA (US)

(73) Assignee: Altera Corporation, San Jose, CA (US)

( * ) Notice: Subject to any disclaimer, the term of this patent is extended or adjusted under 35 U.S.C. 154(b) by 397 days.

(21) Appl. No.: 09/668,406

(22) Filed: Sep. 22, 2000

Related U.S. Application Data

(60) Provisional application No. 60/156,014, filed on Sep. 23, 1999.

(51) Int. Cl.[7] .............................................. G06F 13/00
(52) U.S. Cl. ...................................... 710/317; 710/310
(58) Field of Search ................... 710/305, 306, 710/307, 313, 317, 310

(56) References Cited

U.S. PATENT DOCUMENTS

| | | | | |
|---|---|---|---|---|
| 5,345,228 A | * | 9/1994 | Franaszek et al. ......... 340/2.25 |
| 5,701,413 A | * | 12/1997 | Zulian et al. ................. 709/214 |
| 6,138,185 A | * | 10/2000 | Nelson et al. ............... 710/317 |
| 6,189,058 B1 | * | 2/2001 | Jones et al. .................. 710/317 |
| 6,327,253 B1 | * | 12/2001 | Frink ........................ 370/260 |
| 6,381,664 B1 | * | 4/2002 | Nishtala et al. .............. 710/313 |

* cited by examiner

Primary Examiner—Glenn A. Auve
(74) Attorney, Agent, or Firm—Fish & Neave; Garry J. Tuma

(57) ABSTRACT

A computer-system bus switch architecture is presented that has high throughput and low latency. The architecture provides a multi-port PCI bus switch that includes a primary port controller, a crossbar switch, and a plurality of secondary port controllers. The primary port controller couples to a main system bus to which, for example, a system controller is coupled, and the secondary port controllers are each coupled to a local bus to which a plurality of peripheral devices are coupled. The crossbar switch selectively routes traffic from any port controller to any other port controller.

27 Claims, 14 Drawing Sheets

FIG. 18  ← 1800

| ADR. | BYTE 3 | BYTE 2 | BYTE 1 | BYTE 0 |
|---|---|---|---|---|
| 00 | DEVICE ID | | VENDOR ID | |
| 04 | STATUS (0) | | COMMAND (0) | |
| 08 | CLASS CODE | | | REVISION ID |
| 0C | BIST | HEADER TYPE | LATENCY TIMER(0) | CACHE LINE SIZE |
| 10 | BASE ADDRESS REGISTER 0 | | | |
| 14 | BASE ADDRESS REGISTER 1 | | | |
| 18 | SECONDARY LATENCY TIMER | SUBORDINATE BUS NUMBER | SECONDARY BUS NUMBER | PRIMARY BUS NUMBER |
| 1C | SECONDARY STATUS | | I/O LIMIT (0) | I/O BASE (0) |
| 20 | MEMORY LIMIT (0) | | MEMORY BASE (0) | |
| 24 | PREFETCHABLE MEMORY LIMIT | | PREFETCHABLE MEMORY BASE | |
| 28 | PREFETCHABLE BASE UPPER 32 | | | |
| 2C | PREFETCHABLE LIMIT UPPER 32 BITS | | | |
| 30 | I/O LIMIT UPPER 16 BITS | | I/O BASE UPPER 16 BITS | |
| 34 | RESERVED | | | CAPABILITIES POINTER |
| 38 | EXPANSION ROM BASE ADDRESS REGISTER | | | |
| 3C | RESERVED | | INTERRUPT PIN | INTERRUPT LINE |
| 40 | STATUS(1) | | BRIDGE CONTROL(1) | |
| 44 | BUS NUMBER(1) | LATENCY TIMER(1) | I/O LIMIT(1) | I/O BASE(1) |
| 48 | MEMORY LIMIT(1) | | MEMORY BASE(1) | |
| 4C | RESERVED | | | |
| 50 | STATUS(2) | | BRIDGE CONTROL(2) | |
| 54 | BUS NUMBER(2) | LATENCY TIMER(2) | I/O LIMIT(2) | I/O BASE(2) |
| 58 | MEMORY LIMIT(2) | | MEMORY BASE(2) | |
| 5C | RESERVED | | | |
| 60 | STATUS(3) | | BRIDGE CONTROL(3) | |
| 64 | BUS NUMBER(3) | LATENCY TIMER(3) | I/O LIMIT(3) | I/O BASE(3) |
| 68 | MEMORY LIMIT(3) | | MEMORY BASE(3) | |
| 6C | RESERVED | | | |
| 70 | STATUS(4) | | BRIDGE CONTROL(4) | |
| 74 | BUS NUMBER(4) | LATENCY TIMER(4) | I/O LIMIT(4) | I/O BASE(4) |
| 78 | MEMORY LIMIT(4) | | MEMORY BASE(4) | |
| 7C | RESERVED | | | |
| 80 | STATUS(5) | | BRIDGE CONTROL(5) | |
| 84 | BUS NUMBER(5) | LATENCY TIMER(5) | I/O LIMIT(5) | I/O BASE(5) |
| 88 | MEMORY LIMIT(5) | | MEMORY BASE(5) | |
| 8C | RESERVED | | | |
| 90 | STATUS(6) | | BRIDGE CONTROL(6) | |
| 94 | BUS NUMBER(6) | LATENCY TIMER(6) | I/O LIMIT(6) | I/O BASE(6) |
| 98 | MEMORY LIMIT(6) | | MEMORY BASE(6) | |
| 9C | RESERVED | | | |
| A0 | RESERVED | | | |
| A4 | RESERVED | | | |
| A8 | RESERVED | | | |
| AC | RESERVED | | | |
| B0 | RESERVED | | PRIMARY SERRn STATUS | PRIMARY SERRn EVENT DISABLE |
| B4-FF | RESERVED | | | |

PCI BUS SWITCH ARCHITECTURE

CROSS REFERENCE TO RELATED APPLICATION

This claims the benefit of United States Provisional Application No. 60/156,014, filed Sep. 23, 1999, which is hereby incorporated by reference herein in its entirety.

BACKGROUND OF THE INVENTION

This invention relates to computer buses. More particularly, this invention relates to a PCI (Peripheral Component Interconnect) bus switch architecture.

Typical computer systems have multiple interconnected PCI buses that transfer "traffic" (e.g., is data and control information) among various logic devices (e.g., a microprocessor, video adapter, and other peripherals) and between those logic devices and, for example, a system controller or central processing unit. Because a PCI bus has a limited load capacity, PCI-to-PCI bridges are used to increase the number of PCI devices that can be coupled in a system. In such systems, a system controller is coupled to a main or first level PCI bus (i.e., PCI Bus 0). Each group of logic devices is typically coupled to a local PCI bus, which is coupled to a PCI bridge. The PCI bridge is also coupled to the main PCI bus. If the number of devices required is very large, multiple PCI bridges are coupled to the main bus.

Traffic transfers between, for example, an initiator logic device A, coupled to a local bus 1, and a target logic device B, coupled to a local bus 2, can execute in many ways depending on the capabilities of the PCI bridge. A basic sequence is as follows: logic device A requests and obtains access to local bus 1; a PCI bridge 1 coupled to local bus 1 then requests and obtains access to main bus 0; a PCI bridge 2 coupled to main bus 0 then requests and obtains access to local bus 2; and lastly, traffic is transferred from logic device A to logic device B.

A disadvantage of such a bus architecture is high traffic latency. This refers to the time required to transfer traffic. More often than not, delays are incurred while waiting for bus access. Furthermore, each PCI bridge typically includes a primary port coupled to the main bus, a secondary port coupled to a local bus, and a port controller coupled between the primary and secondary ports. Thus, a traffic transfer between any two logic devices not coupled to the same local bus incurs notable time delays through the two PCI bridges (i.e., four PCI interfaces). Such time delays undesirably slow overall system performance.

Another disadvantage of such traffic transfers is low throughput. Throughput can be measured in megabytes per second and refers to the data transfer rate through a system. Traffic transfers generally can only be executed between the two PCI bridges on the same bus. Other traffic transfers between non-locally coupled logic devices normally have to wait until the current transfer completes before access to the main bus can be obtained. Referring to the above traffic transfer example between logic devices A and B, a traffic transfer between logic devices C and D, for example, as well as other traffic transfers to device B, have to wait until the A to B transfer is complete. Conceivably, many traffic transfers can be waiting at any given moment, adversely affecting throughput. Thus, traffic throughput is generally limited by the PCI bridge operating at the slowest speed (typically measured in megahertz) and having the narrowest bus width (e.g., 32 bits).

In view of the foregoing, it would be desirable to provide a bus switch architecture that has low traffic latency.

It would also be desirable to provide a bus switch architecture that has high traffic throughput.

SUMMARY OF THE INVENTION

It is an object of this invention to provide a bus switch architecture that has low traffic latency.

It is also an object of this invention to provide a bus switch architecture that has high traffic throughput.

In accordance with this invention, a bus switch architecture is provided that has low latency and high throughput. This is accomplished by providing a PCI bus switch having a primary port controller that interfaces with, for example, a system controller, and a plurality of secondary port controllers that each interface with one or more logic devices. The primary and secondary port controllers couple to a crossbar switch. Each port controller can advantageously operate at speeds independent of the other port controllers. Thus, for example, the primary port controller can advantageously transfer traffic at higher speeds than the secondary port controllers. Moreover, the PCI bus switch can transfer traffic from non-overlapping pairs of logic devices substantially simultaneously, thus improving throughput. Such transfers between logic devices not coupled to the same local bus no longer need to be processed through two primary ports and routed across the main bus, but instead are processed through secondary port controllers and the crossbar switch. These transfers are not dependent on the availability of the main bus. Moreover, latency of such device-to-device transfers is lowered by eliminating traffic transfers through two PCI interfaces (i.e., the primary ports of two PCI bridges).

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which:

FIG. 18 is a simplified block diagram showing an illustrative embodiment of a configuration space header in accordance with the present invention.

DETAILED DESCRIPTION OF THE INVENTION

Figure 1:
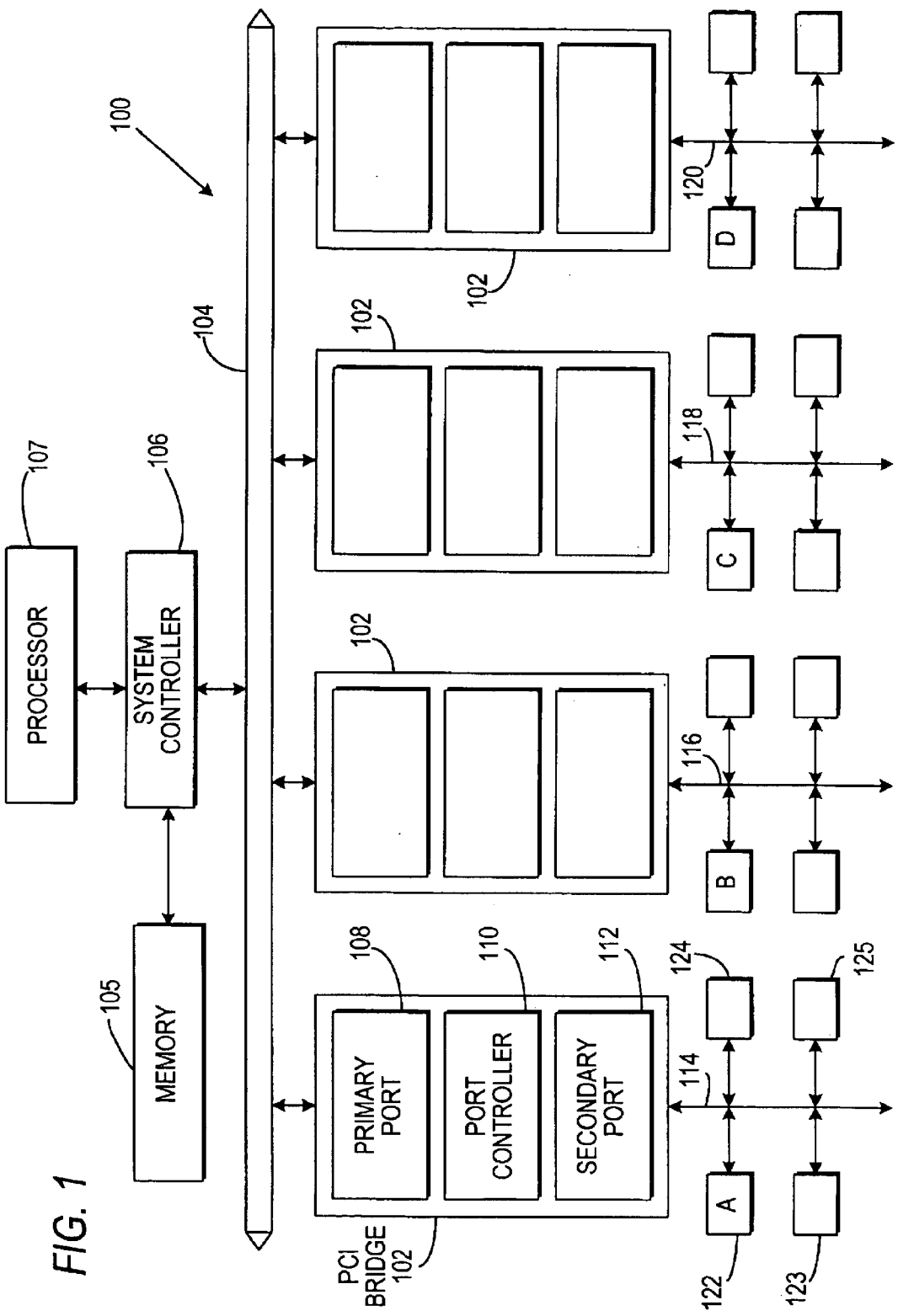
FIG. 1 is a simplified schematic block diagram of a conventional PCI bus bridge architecture.

Conventional PCI bus switch architecture 100 shown in FIG. 1 includes a plurality of PCI bridges 102 and a system controller 106 coupled to a PCI main bus 104. Main bus 104 can typically support up to ten PCI loads. Each PCI bridge 102 includes a primary port 108, a port controller 110, and a secondary port 112. Primary ports 108 are coupled to main bus 104, and secondary ports 112 are coupled respectively to local buses 114, 116, 118, and 120. Each local bus couples to a group (e.g., A–D) of logic devices. For example, logic devices 122–125 couple to local bus 114.

Such an architecture involves a significant amount of PCI overhead with respect to traffic transfers between devices of different groups (e.g., a traffic transfer between a device in group A and a device in group C). Each such transfer involves two local buses (e.g., local buses 114 and 118), two secondary ports 112, two port controllers 110, two primary ports 108, and main bus 104. In particular, four PCI interfaces are involved. The present invention advantageously eliminates some of that overhead, increases traffic throughput, and lowers traffic latency.

Figure 2:
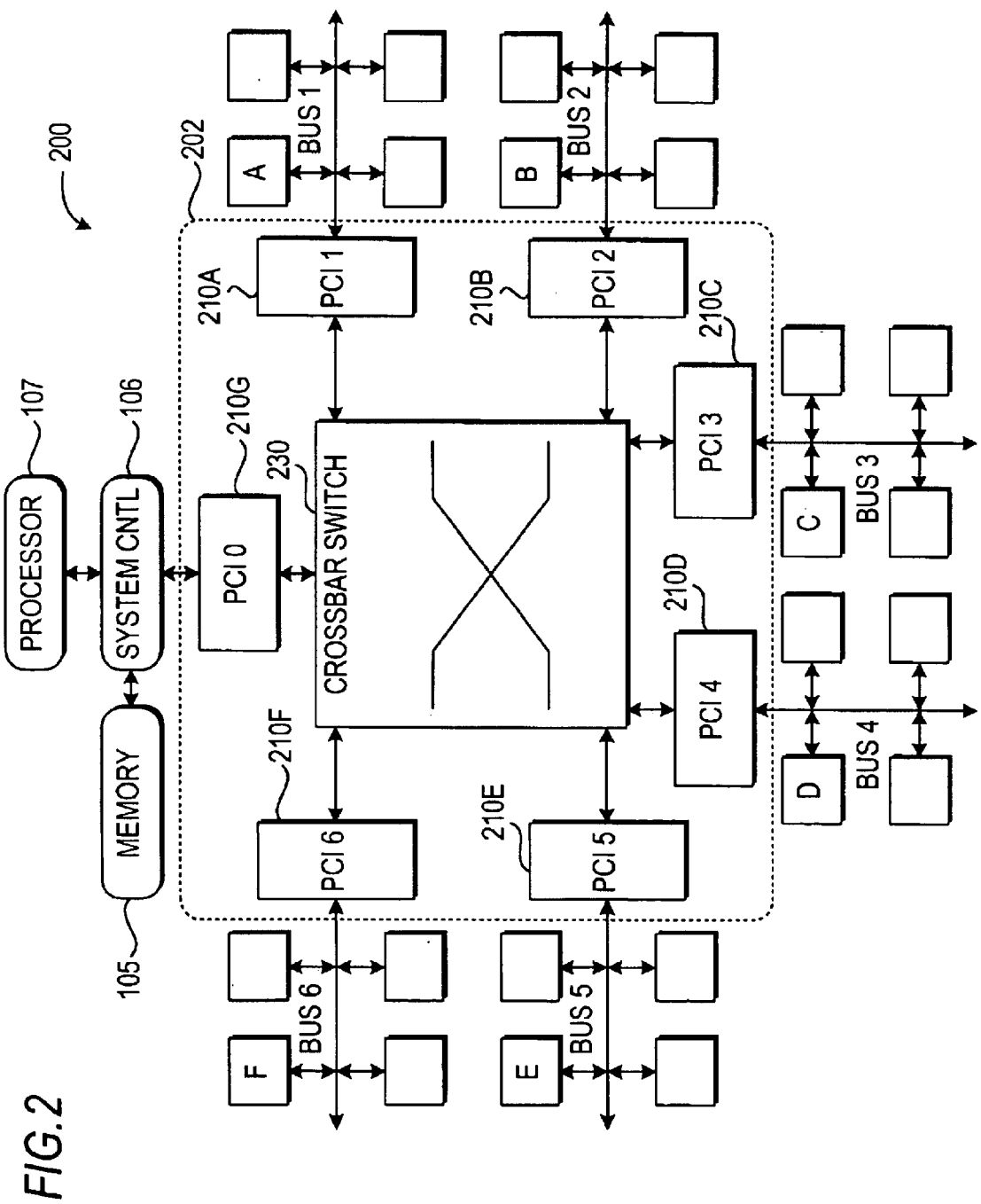
FIG. 2 is a simplified schematic block diagram of an exemplary embodiment of a PCI bus switch architecture in accordance with the present invention.

FIG. 2 shows an exemplary embodiment of a PCI bus switch architecture 200 in accordance with the present invention. PCI bus switch 202 includes a plurality of PCI port controllers 210A–G and a crossbar switch 230. Port controllers 210A–G are each coupled to a PCI bus. Note that while only seven port controllers are shown for illustrative purposes only, PCI bus switch 202 can include other numbers of port controllers 210 greater than or equal to two. Port controller 210G couples to a main system bus to which, for example, a system controller 106 is coupled. Port controller 210G operates analogously to a primary port 108 and corresponding functional portion of port controller 110 of a conventional PCI bridge 102, and is referred to as the primary port controller. Port controllers 210A–F couple to respective local buses to which logic device groups A–F are respectively coupled. Each port controller 210A–F operates analogously to a secondary port 122 and corresponding functional portion of port controller 110, and are referred to as secondary port controllers. Note that a secondary port controller need not be coupled to a plurality of logic devices as shown, but can be alternatively coupled to a single logic device. Also note that different numbers of secondary port controllers can operate with the is primary port controller. PCI bus switch 202 can be considered a multi-port PCI bridge.

PCI bus switch 202 has the following advantages: port controllers 210A–G are preferably PCI compliant and preferably backwards compatible to existing PCI cards; less than the full number of available secondary ports can be operated; in most case, if not all, runtime software does not require modification; and crossbar switch 230 is transparent to both an initiator logic device and a target logic device during normal operation. Crossbar switch 230 also exhibits a non-blocking behavior, which is described in more detail below. PCI bus switch 202 can advantageously replace a plurality of conventional PCI bridges 102, and has two less PCI interfaces for traffic transfers between logic devices coupled to different buses.

Figure 3:
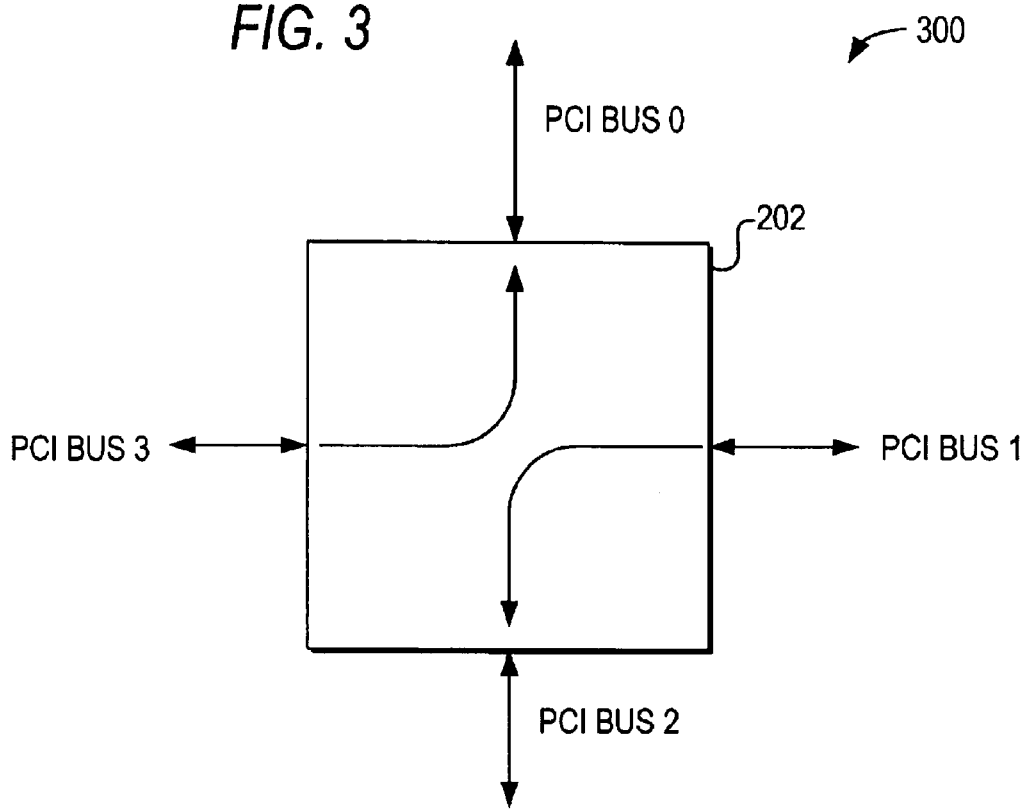
FIG. 3 is a simplified block diagram illustrating a peer-to-peer traffic pattern.
Figure 4:
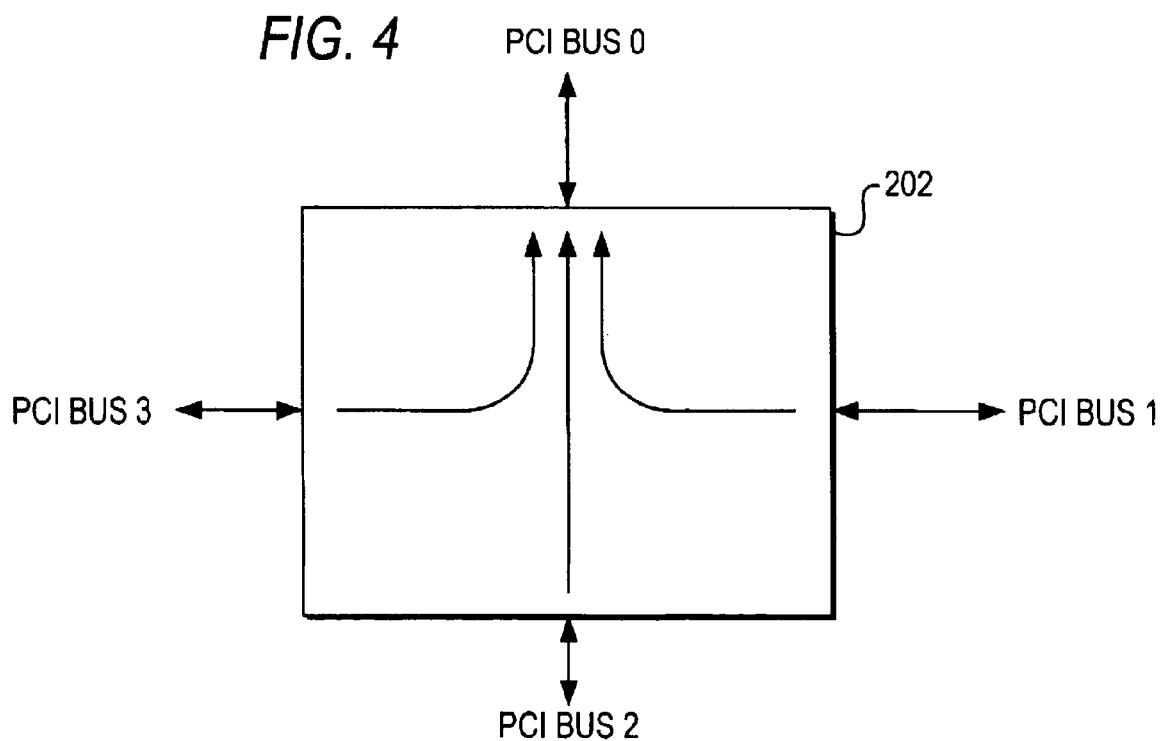
FIG. 4 is a simplified block diagram illustrating an aggregation traffic pattern.

PCI bus switch 202 improves traffic transfers for both peer-to-peer and aggregation traffic patterns. A peer-to-peer traffic pattern is illustrated in FIG. 3. Peer-to-peer traffic is distributed between ports on bus switch 202 such that no port is favored. This traffic pattern allows for concurrent traffic transfers through bus switch 202 between different port pairs, and is typical of distributed memory parallel processing systems. FIG. 4 illustrates an aggregation traffic pattern. This pattern is characterized by more traffic transferring (i.e., aggregating) to or from one port than other ports. Such traffic transfers are typically interleaved. The bandwidth of a switch is generally limited to the bandwidth of the port to or from which such traffic aggregates. Aggregation traffic patterns are typical of shared memory parallel processing systems.

Port controllers 210A–G advantageously can operate at speeds and with bus widths (e.g., 32 or 64 bits) independent of each other to accommodate different throughput requirements and types of traffic patterns. For example, some applications may require primary port controller 210G to operate at a higher speed and at higher bandwidth than port controllers 210A–F. Thus, port controller 210G may operate at, for example, 66 MHz with a bus width of 64 bits, resulting in 512 Mbytes/sec (a PCI standard), while each port controller 210A–F may operate at, for example, 33 MHz with a bus width of 32 bits, resulting in 128 Mbytes/sec (another PCI standard). This provides higher throughput in those cases where aggregate traffic at port controller 210G is dominant.

Figure 5:
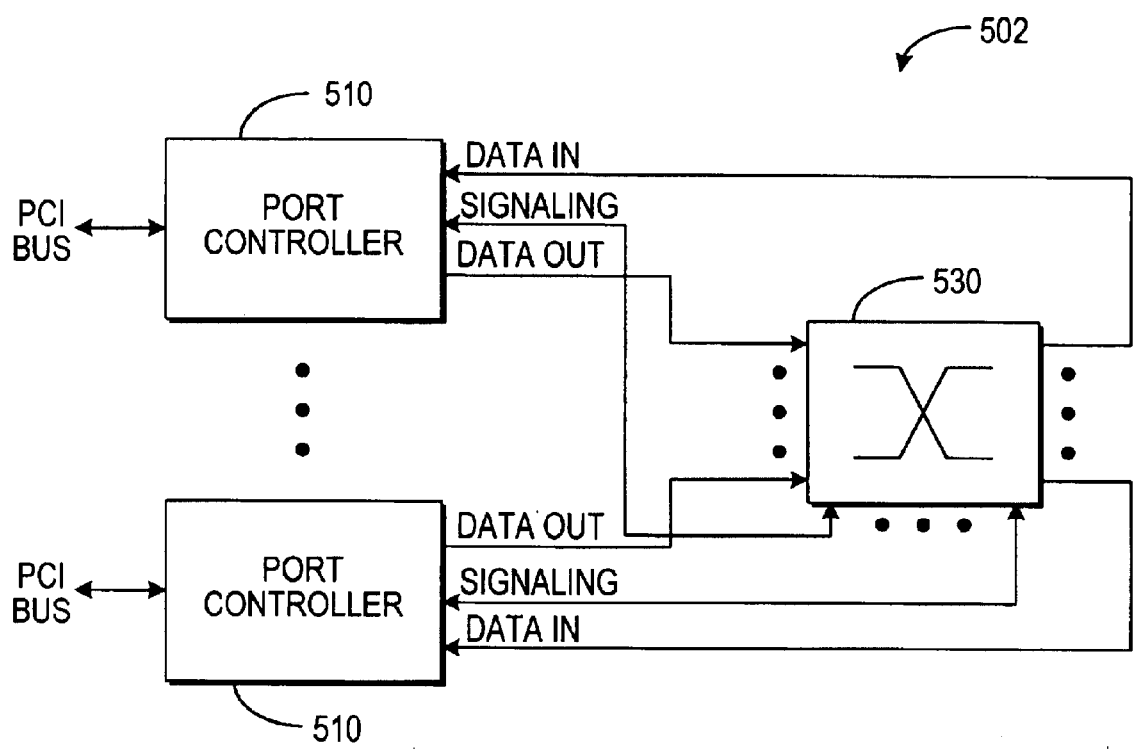
FIG. 5 is a simplified schematic block diagram showing in more detail an illustrative embodiment of a representative portion of the PCI bus switch architecture of FIG. 2 in accordance with the present invention.

FIG. 5 shows in more detail a representative portion of bus switch 202 in accordance with the present invention. Each port controller 510 couples to preferably a PCI bus on one side and a port of crossbar switch 530 on the other side. PCI controllers 510 preferably adhere to PCI standards and preferably perform the following: traffic address decoding and port number mapping; initiator and target handshaking; parity generation and checking; crossbar switch 530 connection requesting; and traffic transaction queuing. A primary port controller 510 (e.g., port controller 210G of FIG. 2) performs configuration transactions in preferably the same way as does a primary port 108 and corresponding functional portion of controller 110 of conventional PCI bridge 102.

Crossbar switch 530 provides interconnectivity between port controllers 510, and arbitrates between concurrent requests to the same port controller 510, as described in more detail below.

Figure 6:
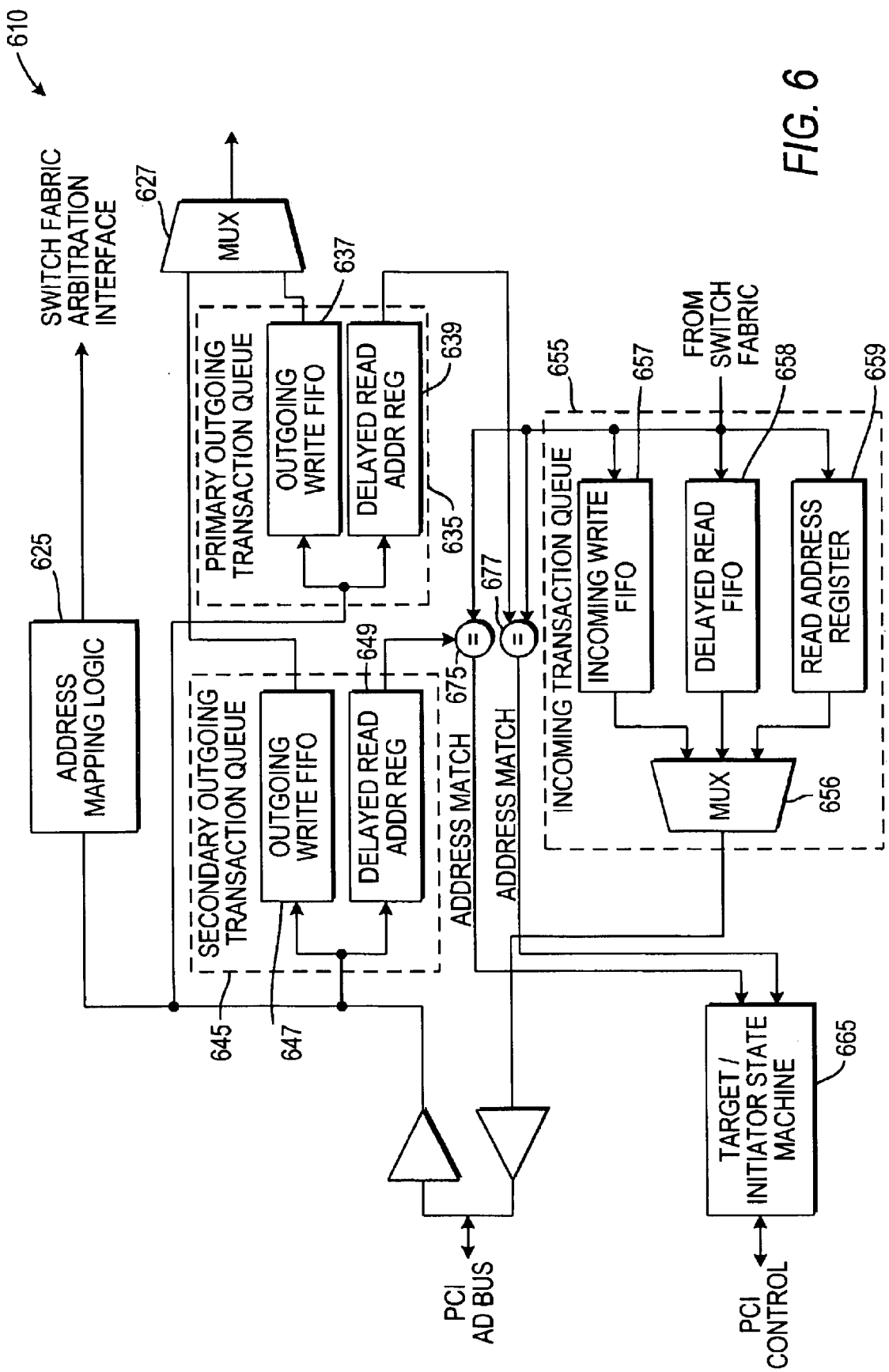
FIG. 6 is a simplified schematic block diagram of an exemplary embodiment of the port controller of FIG. 2 in accordance with the present invention.

FIG. 6 shows an exemplary embodiment of a port controller in accordance with the present invention. Port controller 610 maintains the bulk of the switching state, and provides transaction sequencing and implements PCI bus protocol. Port controller 610 preferably includes address mapping logic 625, primary outgoing transaction queue 635, secondary outgoing transaction queue 645, incoming transaction queue 655, target/initiator state machine 665, and address comparators 675 and 677. Optionally, additional incoming and secondary queues can be added to port controller 610. Alternatively, port controller 610 can have only one outgoing transaction queue.

Address mapping logic 625 maps PCI addresses to switch port numbers and negotiates port connections through crossbar switch 230 when a transaction on a local PCI bus maps to another port on switch 230. Address mapping logic 625 performs positive address decoding and includes memory address registers that contain addresses defining the address range of each port of bus switch 202. This allows address mapping logic 625 to claim and forward transactions between itself and other port controllers. Each address mapping logic 625 of each port controller 610 knows the other port controller's addresses and routes each transaction based on the address range defined for each port controller.

Outgoing transactions are forwarded from one port controller through crossbar switch 230 to another port controller. In one embodiment, all port controllers except the primary port controller (e.g., port controller 210G of FIG. 2) have two outgoing transaction queues to store outgoing transactions. Primary outgoing transaction queue 635 stores transactions destined for the primary port controller, while secondary outgoing transaction queue 645 stores transactions destined for any of the secondary port controllers. This queue configuration accommodates both traffic patterns described above while maintaining a non-blocking nature between the two patterns. Queue configuration can be advantageously customized according to traffic patterns and throughput requirements.

Figure 7:
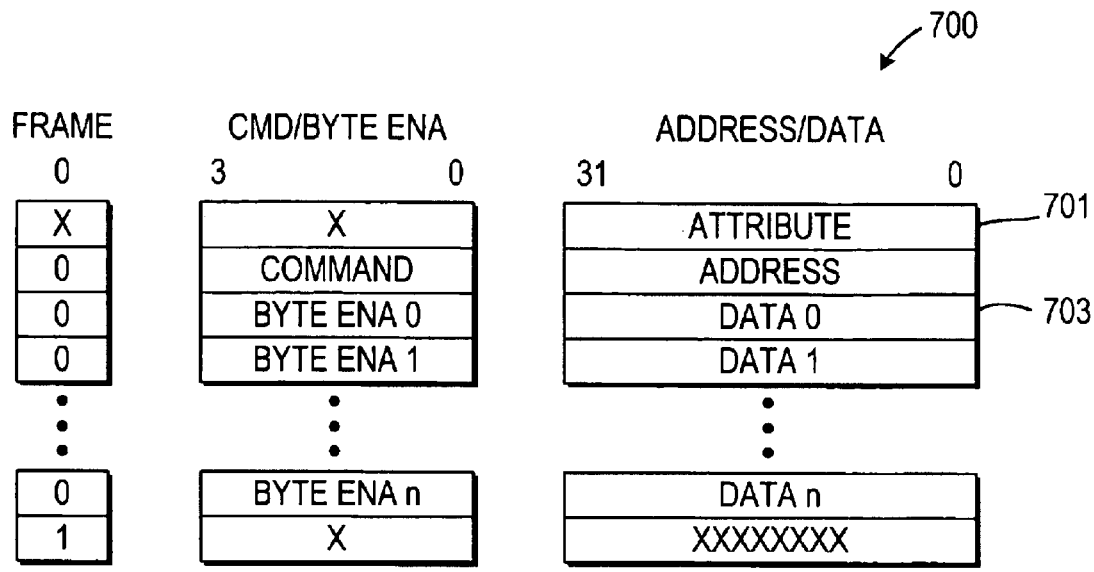
FIGS. 7–11 are simplified diagrams of illustrative embodiments of formats for transaction queues of the port controller of FIG. 6 in accordance with the present invention.
Figure 8:
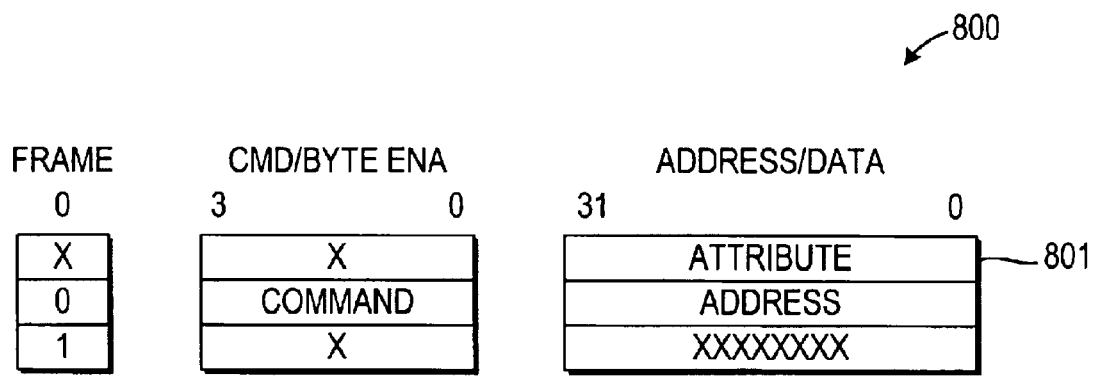

Each queue can store either a posted write or a delayed read transaction, and includes an outgoing write FIFO (first in, first out) 637,647 and a delayed read register 639,649. Outgoing write FIFOs 637,647 store transaction information to be transferred to crossbar switch 230. The transaction information can be either write transaction information or delayed read transaction information. FIG. 7 shows an illustrative embodiment of a format 700 for write transaction information stored in outgoing write FIFOs 637,647 in accordance with the present invention. The first value stored in FIFOs 637,647 is an attribute 701 that holds routing information necessary when requesting connections through crossbar switch 230. Write transaction data is stored in FIFOs 637,647 beginning in field 703. FIG. 8 shows an illustrative embodiment of a format 800 for delayed read transaction information stored in FIFOs 637,647 in accordance with the present invention. Note that no data is stored in the FIFO for delayed read transactions. A read request address is stored in delayed read registers 639,649 to monitor completion of delayed read transactions that had begun earlier but had not yet completed (delayed read transactions are described in more detail below).

Figure 9:
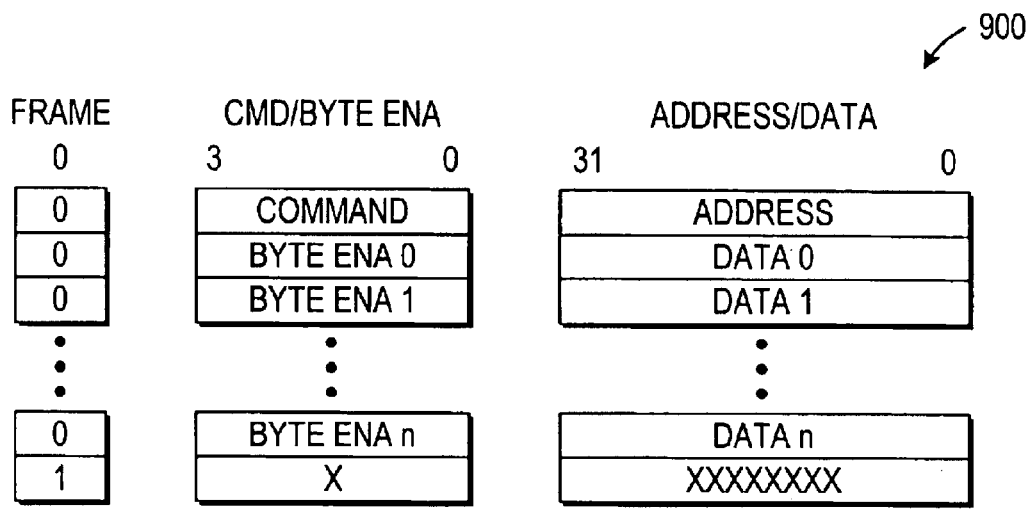

Incoming transactions (i.e., transactions from crossbar switch 230 destined for a PCI bus) are captured in one of three storage elements in incoming transaction queue 655: incoming write FIFO 657, delayed read FIFO 658, and read address register 659. In accordance with the type of transaction, port controller 610 determines in which of the three storage elements to store transaction information. For example, write transaction address and data received from crossbar switch 230 are stored in incoming write FIFO 657. FIG. 9 shows an illustrative embodiment of a format 900 for write transaction information stored in incoming write FIFO 657 in accordance with the present invention. Note that the data format is similar to outgoing write FIFOs 637,647 except that an attribute is not stored. Such an attribute is not stored because at this point port controller 610 does not require one.

Figure 10:
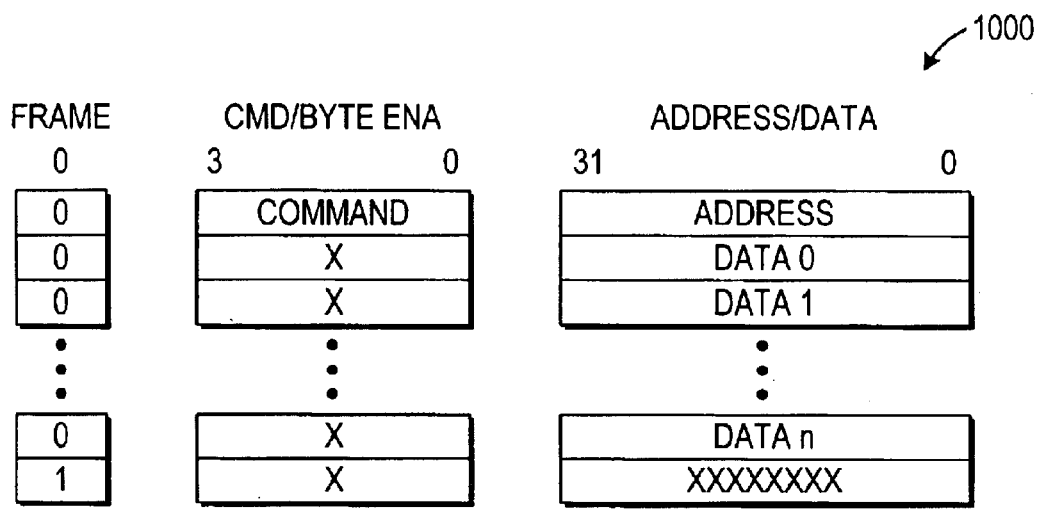

Delayed read FIFO 658 stores the address and data for a delayed read transaction that was requested from that port controller 610. FIG. 10 shows an illustrative embodiment of a format 1000 for delayed read information stored in delayed read FIFO 658 in accordance with the present invention.

Figure 11:
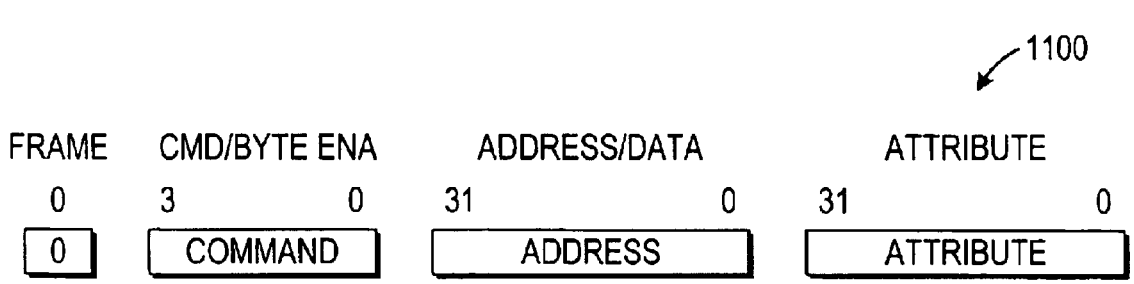

FIG. 11 shows an illustrative embodiment of a format 1100 for information stored in read address register 659 in accordance with the present invention. The information stored in read address register 659 is used to complete a read transaction. Attribute 1101 provides the information necessary to reroute read data back to the initiating port controller.

Returning to FIG. 6, control logic of port controller 610 includes target/initiator state machine 665 and address comparators 675 and 677. State machine 665 controls PCI bus operation. It preferably implements appropriate PCI protocols for either a primary or secondary PCI interface (recall that one port controller functions as the primary interface of bus switch 202 and the other port controllers function as secondary interfaces). State machine 665 also tracks queued transactions, and accepts and converts configuration transactions (e.g., transactions to configure PCI bus switch 202).

Address comparators 675 and 677 compare the address of transactions received from crossbar switch 230 to addresses of outstanding delayed read transactions stored in delayed read register 639, 649, or 659 to determine whether the received transaction completes an outstanding delayed read transaction.

Crossbar switch 230 preferably provides non-blocking, full duplex, space switching for the port controllers. Non-blocking refers to non-overlapping transactions (e.g., not to the same port) that preferably occur simultaneously without interference. Full duplex refers to port controllers simultaneously sending and receiving transactions through crossbar switch 230. And space switching refers to connectivity between port controllers with no storage of traffic.

Figure 12:
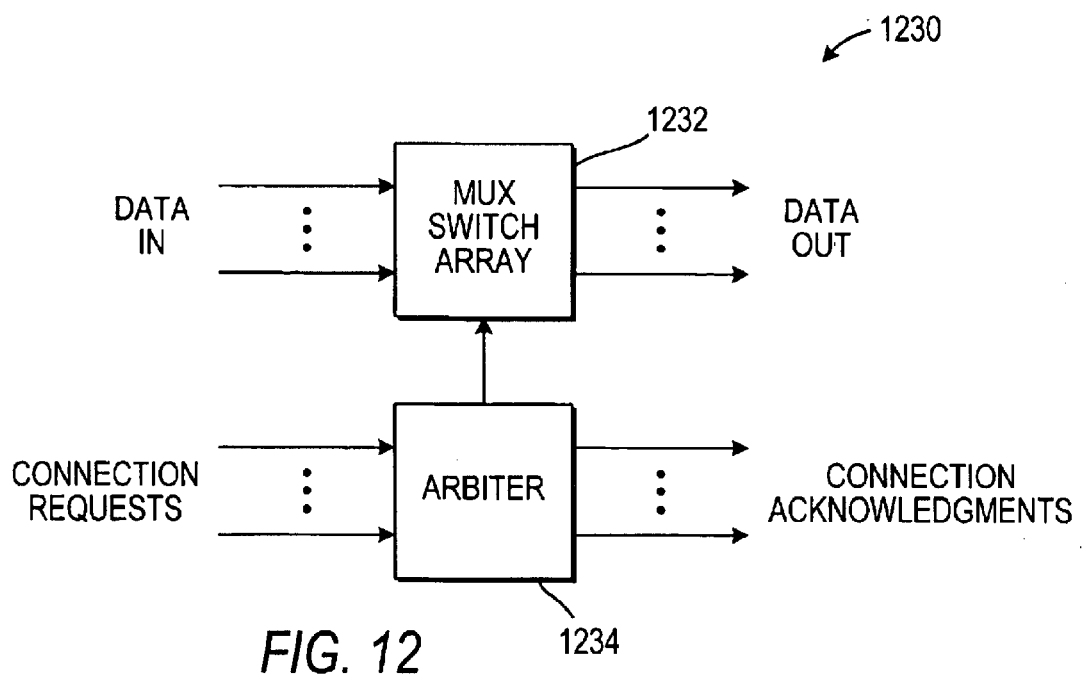
FIG. 12 is a simplified schematic block diagram showing in more detail an illustrative embodiment of the crossbar switch of FIG. 2 in accordance with the present invention.
Figure 13:
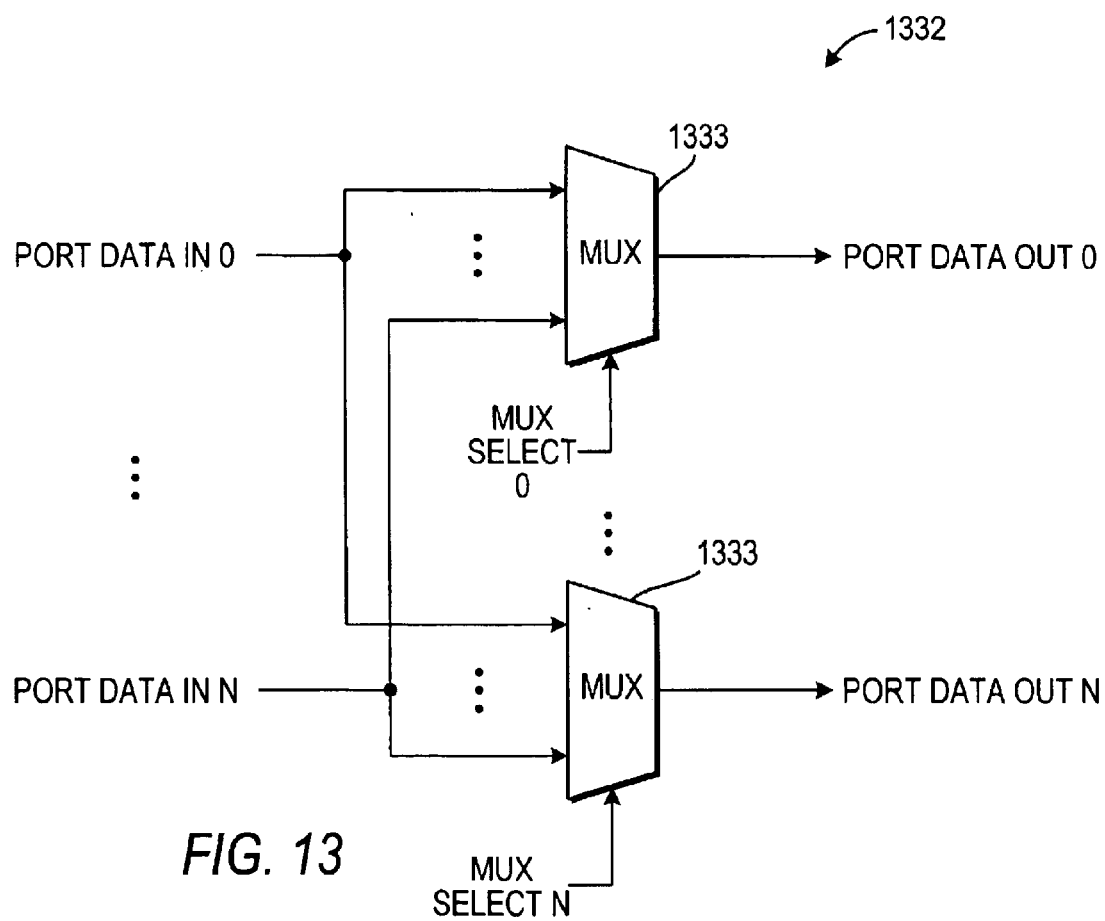
FIG. 13 is a simplified schematic block diagram showing in more detail an illustrative embodiment of a representative portion of the multiplexer switch array of FIG. 12 in accordance with the present invention.

FIG. 12 shows two major components of an embodiment of crossbar switch 230 in accordance with the present invention. Crossbar switch 1230 includes a multiplexer switch array 1232 and an arbiter 1234. Multiplexer switch array 1232 includes a preferably one-stage array of N-1 multiplexers, where N is the number of port controllers coupled to crossbar switch 1230. An illustrative embodiment of switch array 1232 is shown in FIG. 13 in accordance with the present invention. Each multiplexer 1333 has at least N-1 input ports to support the transfer of data to the current port controller from any one of the input ports connected to the other port controllers. Alternatively, switch array 1232 can have N multiplexers 1333 (as shown) to allow for a port controller to loop data back to itself for testing purposes. Selection of an input port for each multiplexer 1333 is controlled by arbiter 1234.

Data paths through switch array 1232 includes the PCI address/data bus, command/byte enable signals, and preferably a FRAME# signal. The FRAME# signal demarcates PCI transactions and is monitored by arbiter 1234.

Data through multiplexer switch array 1232 may be pipelined. Because arbiter 1234 monitors the FRAME# signal at the output of array 1232, pipeline stages can be added without affecting sequencing. However, these stages add latency and preferably should be avoided when possible.

Arbiter 1234 resolves which input port is allowed to connect with a given output port. Arbiter 1234 receives port IDs and connection requests from port controllers. In general applications, a rotating priority scheme is used by arbiter 1234 to ensure equal access among competing ports. Priority schemes are important with respect to traffic aggregation patterns, and advantageously can be customized in accordance with system requirements. Upon completion of the requested connection, arbiter 1234 issues an acknowledgment to the requesting port controller. Upon receipt of the acknowledgment, that port controller can begin transferring traffic.

Figure 14:
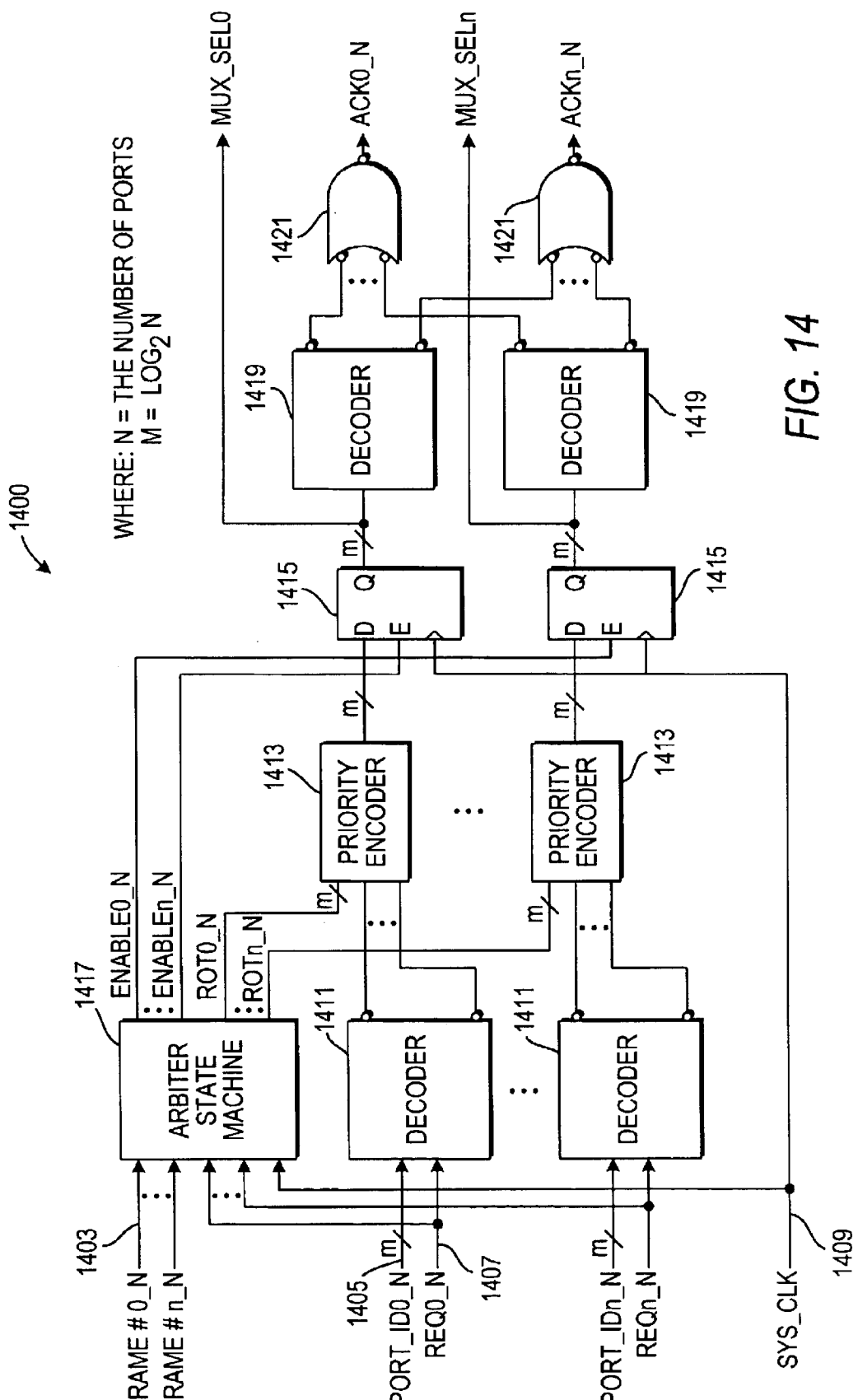
FIG. 14 is a simplified schematic block diagram showing in more detail an illustrative embodiment of a representative portion of the arbiter of FIG. 12 in accordance with the present invention.

FIG. 14 shows an illustrative embodiment of arbiter 1234 in accordance with the present invention. Input signals to arbiter 1400 include FRAME# 1403, port ID 1405, request 1407, and system clock 1409. Port ID 1405 signals are driven by individual port controllers to indicate the ID of the port to which access is being requested. A request 1407 signal requests access to multiplexer switch array 1232. A FRAME# 1403 signal indicates when switch array 1232 has completed transferring data. Note that FRAME# 1403 signals are an output of switch array 1232 and are routed back to arbiter 1234.

Figure 15:
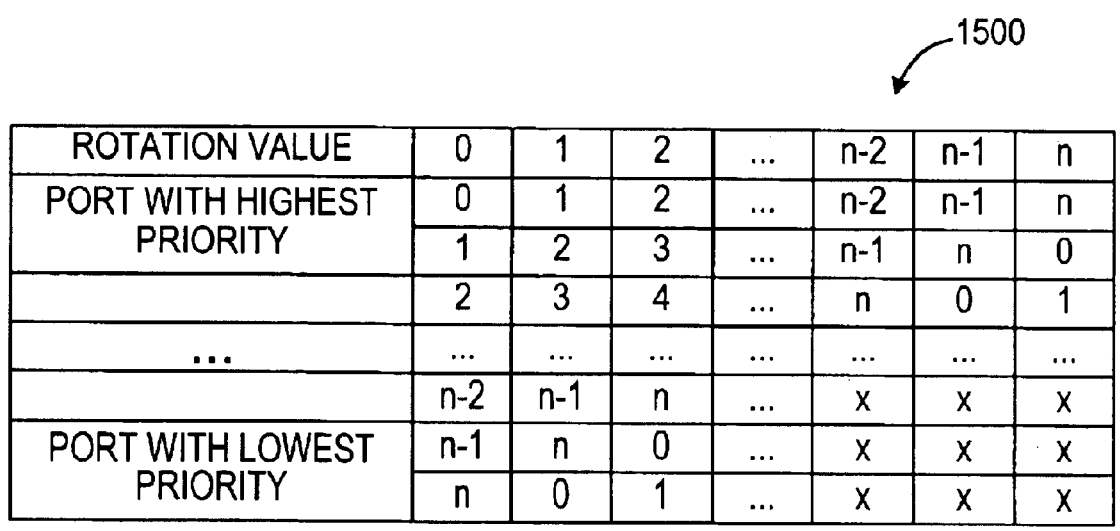
FIG. 15 is a table showing an illustrative embodiment of a port selection priority scheme for the arbiter of FIG. 12 in accordance with the present invention.

Port ID 1405 signals and request 1407 signals are decoded at decoders 1411 into an array of connection requests. The outputs of decoders 1411 are input to port priority encoders 1413. Encoders 1413 determine which input port will be connected to an output port in accordance with the number of ports concurrently requesting connections to the same output port and the priorities of those requesting ports as determined by a port selection priority scheme. FIG. 15 shows an example of a priority scheme that uses a rotating priority algorithm in accordance with the present invention. Table 1500 shows how the rotation value affects the relative priorities of competing ports. Advantageously, priority schemes other than that shown in table 1500 can be used to determine port priority in view of particular traffic patterns and desired throughputs and latencies.

The output of each priority encoder 1413 feeds a register 1415 that is enabled by an arbiter state machine 1417. Arbiter state machine 1417 determines port priority via a priority scheme and checks the availability of the requested output port by monitoring the FRAME# 1403 signal for that port. The results of each port arbitration contest are sampled, by enabling register 1415, as each output port becomes available, or when at least one contender for the output port exists. Register 1415 supports the pipelining of arbitration contests for an output port with concurrent transfers thereto.

The output of register 1415 is used directly as the select signal for the data multiplexer 1333 corresponding to that port in multiplexer switch array 1232. That output is also decoded at decoder 1419 to generate the connection acknowledgments to the particular port controller.

Transactions (e.g., reads or writes) through PCI bus switch 202 preferably include one or two address phases followed by one or more data phases. An address phase is preferably accomplished in a single PCI clock cycle. The number of address phases depends on whether the address is 32 bits or 64 bits, and is designated by an asserting (e.g., preferably falling) edge of signal FRAME# 1403.

The data phase (i.e., a transfer of data) occurs when both an "initiator ready" signal and a "target ready" signal are asserted during the same PCI clock cycle. The last data phase of a transaction occurs when signal FRAME# 1403 is de-asserted after both initiator and target ready signals are asserted, or when the initiator signal and a "stop" signal are asserted.

Figure 16:
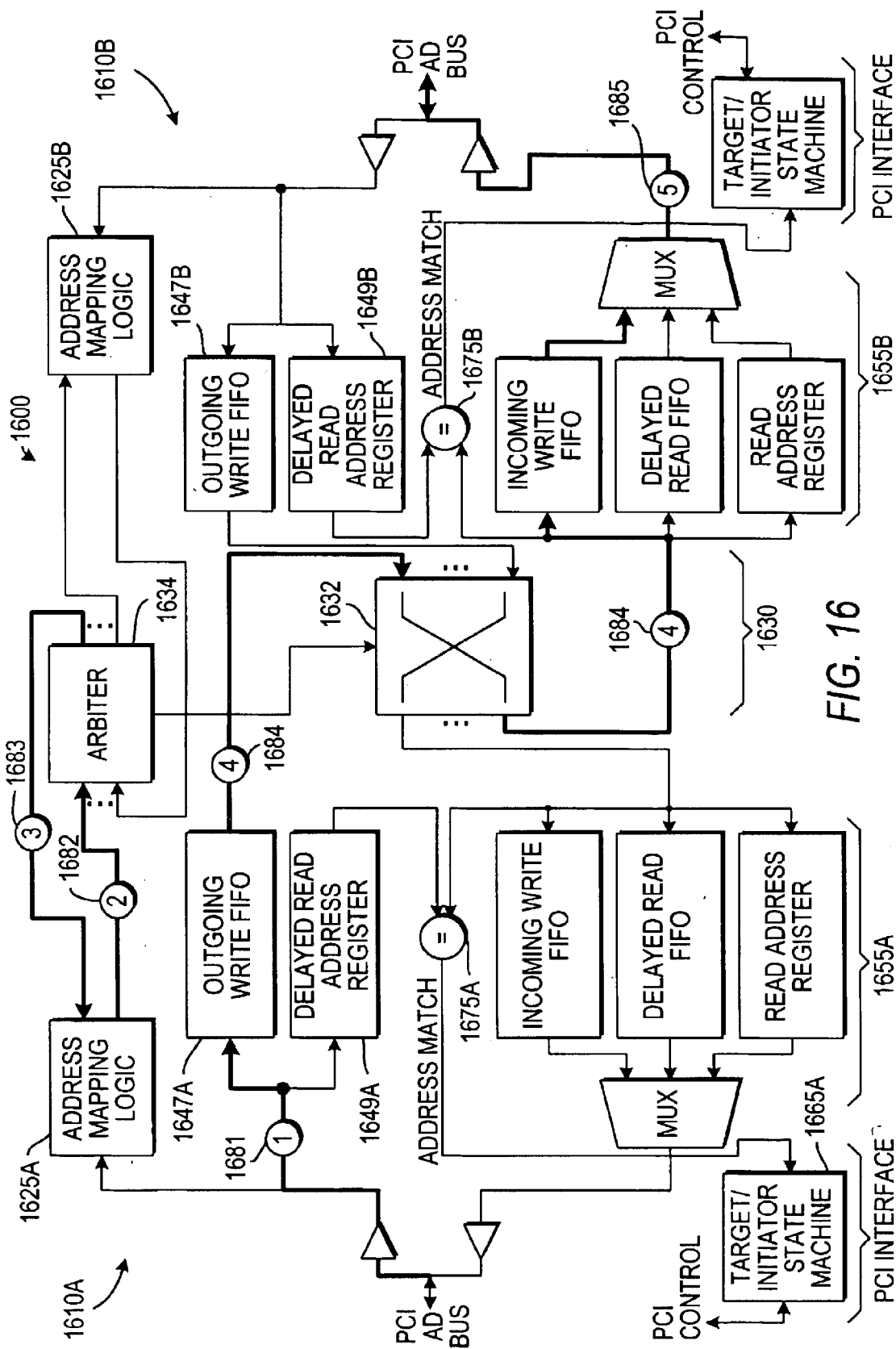
FIG. 16 is a simplified schematic block diagram showing an illustrative embodiment of a write transaction through the PCI bus switch of FIG. 2 in accordance with the present invention.

FIG. 16 shows an example of a write transaction as it preferably flows through PCI bus switch 202 in accordance with the present invention. For clarity, only a single set of outgoing transaction queues (i.e., outgoing write FIFO 1647A,B and delayed read address registers 1649A,B) and address comparators 1675A,B are shown for port controllers 1610A,B. In general, write transactions can be posted write or delayed write transactions. PCI bus switch 202 preferably transacts posted write transactions. This advantageously permits bus switch 202 to accept write data into incoming write transaction queue 1655 before obtaining access to the target bus.

The primary port controller preferably has a single outgoing transaction queue (e.g., as shown in FIG. 16 by port controllers 1610A or 1610B). The secondary port controllers preferably have two outgoing transactions queues (e.g., as shown in FIG. 6 by port controller 610), one for writes destined for the primary port controller and the other for writes destined for any of the secondary port controllers. Each outgoing transaction queue buffers a single transaction of preferably up to 16 doublewords in length.

At 1681, address mapping logic 1625A decodes the address present during the address phase of the transaction to determine if the address maps to the address space of a bus on one of the other ports. Address mapping logic 1625A also determines whether the destination is the primary port or one of the secondary ports. If the transaction is destined for one of the ports on bus switch 202, address mapping logic claims the transaction by asserting a "device select" signal with slow timing.

If the appropriate outgoing transaction queue (i.e., primary or secondary) is not full, port controller 1610A asserts the target ready signal in preferably the same clock cycle as the device select signal. PCI bus switch 202 preferably accepts one doubleword of write data per clock cycle, storing that data in the appropriate outgoing transaction queue. PCI bus switch 202 continues to accept write data until either the queue fills up or the initiator logic device terminates the transaction by de-asserting signals FRAME# 1403 and "initiator ready." If the appropriate outgoing transaction queue is full, port controller 1610A defers the transaction by issuing a "retry termination" signal.

At 1682, address mapping logic 1625A requests connection to the destination port and waits for an acknowledgment from arbiter 1634. Upon establishment of the requested connection, at 1683, arbiter 1634 acknowledges the connection request.

At 1684, write data is transferred from the primary or secondary outgoing transaction queue through multiplexer switch array 1632 into incoming transaction queue 1655B in target port controller 1610B. Upon completion of the transfer, and the write data's subsequent reaching the top of the queue (also referred to as head-of-line position), indicating that the data is ready for transfer out of the queue, state machine 1665B requests access to the target bus coupled to port controller 1610B.

When access to the target bus has been obtained, the write data, at 1685, is transferred from incoming transaction queue 1655B across the target bus to the target logic device.

Figure 17:
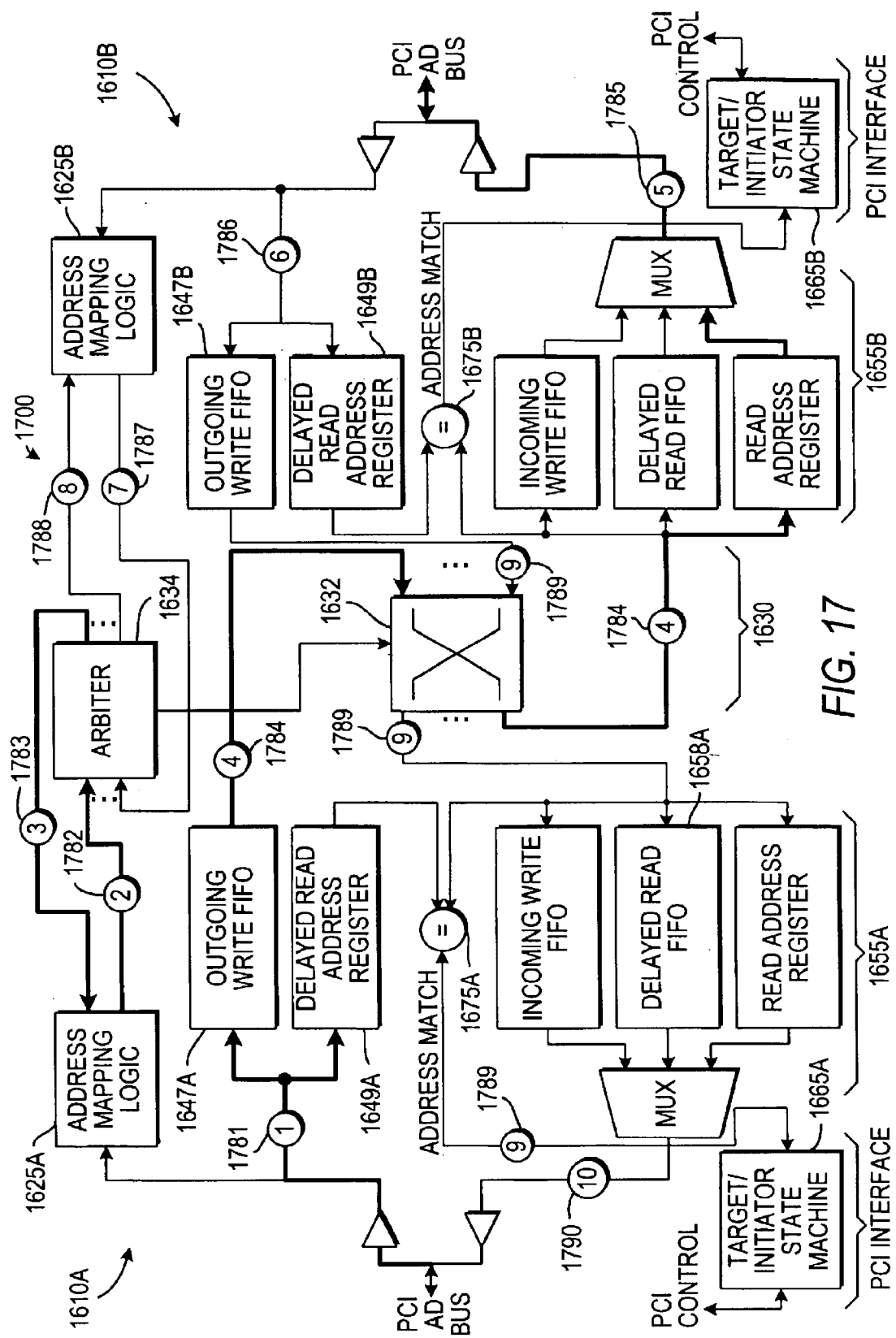
FIG. 17 is a simplified schematic block diagram showing an illustrative embodiment of a read transaction through the PCI bus switch of FIG. 2 in accordance with the present invention.

FIG. 17 shows an example of a read transaction as it preferably flows through PCI bus switch 202 in accordance with the present invention. For clarity, FIG. 17 also shows only a single set of outgoing transaction queues (i.e., outgoing write FIFO 1647A,B and delayed read address registers 1649A,B) and address comparators 1675A,B. All read transactions are processed by PCI bus switch 202 preferably as delayed read transactions. This involves processing a read transaction as two transactions, one transferring the read address to the target logic device, and the other returning the requested read data back to the initiator logic device. This prevents a read transaction from tying up a bus or PCI bus switch 202 unnecessarily while waiting for a target logic device to retrieve data.

At 1781, address mapping logic 1625A decodes an address received from an initiator logic device to determine whether the address maps to the address space of a bus on one of the ports of bus switch 202. If so, port controller 1610A claims the transaction and loads the address and other control and attribute information into an outgoing transaction queue. The read address is stored in a delayed read address register (e.g., delayed read address register 1649A). PCI bus switch 202 then disconnects from the initiator logic device.

At 1782, address mapping logic 1625A requests connection to the port corresponding to the target address and waits for acknowledgment from arbiter 1634. Upon establishment of the requested connection, at 1783, arbiter 1634 acknowledges the connection request.

At 1784, the read request transfers from the outgoing transaction queue through multiplexer switch array 1632 into incoming transaction queue 1655B. As this occurs, address comparator 1675B compares the incoming address with stored addresses of earlier transactions to determine whether this transfer is a completion of an earlier not-yet-completed read transaction. Because this is a new transaction, no match is found, and the earlier read transactions remain pending. Upon completion of the transfer, and the read data's subsequent reaching the top of the queue, state machine 1665B arbitrates for the target bus coupled to port controller 1610B.

At 1785, the read transaction request is forwarded to the target logic device. The target logic device then proceeds to obtain the read data. Upon obtaining the read data, the target logic device, now in effect becoming an initiator logic device, signals port controller 1610B. Address logic mapping logic 1625B again performs address checking as before.

Upon receiving device and target ready signals, at 1786, port controller 1610B loads read data into the appropriate outgoing transaction queue (i.e., either the primary or secondary queue). One doubleword of read data can be preferably loaded during each PCI clock cycle.

At 1787, address mapping logic 1625B requests connection to the port controller corresponding to the address of the logic device that originally initiated the read transaction. Upon establishment of the requested connection, at 1788, arbiter 1634 acknowledges the connection request to address mapping logic 1625B.

At 1789, read data transfers from the outgoing transaction queue through multiplexer switch array 1632 into delayed read FIFO 1658A. As this occurs, address comparator 1675A compares the address of the incoming transaction to addresses of outstanding delayed read transactions to determine whether this is a completion of an earlier transaction. In this case, it is, and a match is found between the incoming transaction address and the previously stored delayed read address. State machine 1665A now waits until the initiator logic device attempts the read again (recall that the connection between the initiator logic device and port controller 1610A was disconnected after the read request information was loaded into the outgoing transaction queue).

Upon the initiator logic device again issuing the read transaction, the read data, at 1790, is transferred from incoming transaction queue 1655A to the initiator logic device, thus completing the read transaction.

The "rules" for using buses (e.g., how long a port controller can access a bus) and information needed by all port controllers (e.g., addresses, responses to various control signals, interrupt line information, etc.) is included in a configuration space in the primary port controller. The primary port controller configures PCI bus switch 202 in accordance with information in configuration space. FIG. 18 shows an illustrative embodiment of a configuration space header that can be used with PCI bus switch 202 in accordance with the present invention. Each port controller preferably has the following registers in configuration space: command or bridge control, status, latency timer, memory base, memory limit, input/output (I/O) base, and I/O limit. The command register controls the operation of the primary port controller, and the status register provides status of the primary interface. Bridge control registers control the operation of secondary port controllers. PCI bus switch 202 uses memory base and limit registers to determine whether to respond to memory transactions and forward them from one port to another. Similarly, I/O base and limit registers are used to determine whether to respond to I/O transactions and forward them from one port to another.

Figure 19:
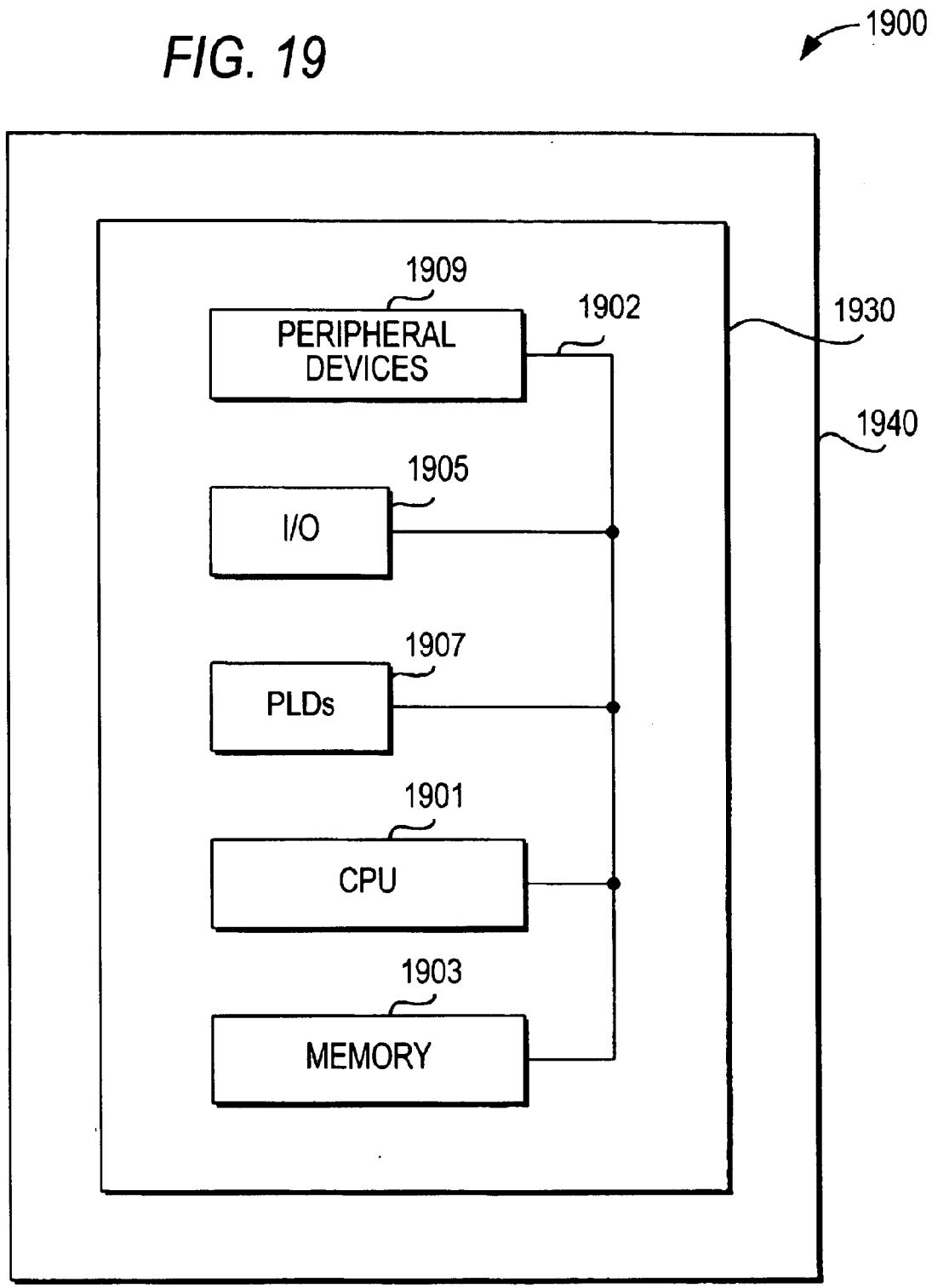
FIG. 19 is a schematic representation of a data processing system that includes an embodiment of the PCI bus switch of FIG. 2 in accordance with the present invention.

FIG. 19 illustrates a data processing system 1900 in which a PCI bus switch of this invention can be used. Data processing system 1900 may include one or more of the following components: a CPU 1901, memory 1903, I/O circuitry 1905, programmable logic devices (PLDs) 1907, and peripheral devices 1909. These components are coupled together by a bus system 1902 that includes a PCI bus switch in accordance with this invention. These components are preferably populated on a circuit board 1930 which is contained in an end-user system 1940.

System 1900 can be used in a wide variety of applications, such as computer networking, data networking, instrumentation, video processing, digital signal processing, or any other application where the advantage of using programmable or reprogrammable logic is desirable. Note that system 1900 is only exemplary, and that the true scope and spirit of the invention should be indicated by the claims below.

Advantageously, the PCI bus switch architecture of the present invention is not limited to PCI, but can be used with other types of communication standards, such as, for example, PCI X, Utopia, Infiniband, and LVDS. Moreover, each port preferably can independently comply with a different protocol or standard. Thus, for example, one port can comply with memory or microprocessor protocols while another port complies with PCI.

Preferably, PCI bus switch 202 is implemented one or more programmable logic devices (PLDs). PLDs commonly have a plurality of substantially identical elements, each of which can be programmed to certain desired logic functions. The logic elements have access to a programmable interconnect structure that allows a user to interconnect the various logic elements in almost any desired configuration. Finally, the interconnect structure also provides access to a plurality of I/O pins, with the connections of the pins to the interconnect structure also being programmable and being made through suitable I/O buffer circuitry. Examples of such devices are shown in Pedersen et al. U.S. Pat. No. 5,260,610, Cliff et al. U.S. Pat. No. 5,260,611, Cliff et al. U.S. Pat. No. 5,689,195, and Cliff et al. U.S. Pat. No. 5,909,126, all of which are hereby incorporated by reference herein.

PCI bus switch 202 is preferably programmable with respect to the following: the number of secondary ports implemented (e.g., less than the full number of available secondary ports can be used); the bus widths of each port; port selection priority schemes; the types of ports (e.g., memory, microprocessor, proprietary, PCI, and PCI X); crossbar switch behavior (e.g., latency, blocking behavior, and clock speed, which can be independent of port clock speeds); the number of incoming and outgoing transaction queues in each of the port controllers; and clocking for each port controller (each port controller can run on a separate independent clock; clock differences can be with respect to frequency or phase).

Thus it is seen that a PCI bus switch is presented in which bus traffic has high throughput and low latency. One skilled in the art will appreciate that the present invention can be practiced by other than the described embodiments, which are presented for purposes of illustration and not of limitation, and the present invention is limited only by the claims which follow.

We claim:

1. A computer-system bus switch comprising:
   a primary port controller operative to transfer traffic to and from a main system bus;
   a plurality of secondary port controllers each operative to transfer traffic to and from a respective local bus; and
   a crossbar switch coupled to said primary port controller and to said secondary port controllers, said crossbar switch operative to selectively transfer traffic from each one of said primary and secondary port controllers to any other one of said primary and secondary port controllers wherein:
      said primary port controller operates at a speed higher than at least one of said secondary port controllers.

2. The bus switch of claim 1 wherein said bus switch complies with Peripheral Component Interconnect standards.

3. The bus switch of claim 1 wherein one of said primary and secondary port controllers complies with a microprocessor interface protocol and another of said primary and secondary port controllers complies with Peripheral Component Interconnect standards.

4. The bus switch of claim 1 wherein said primary port controller operates at about 66 MHz and at least one of said secondary port controllers operates at about 33 MHz.

5. A computer-system bus switch comprising:
   a primary port controller operative to transfer traffic to and from a main system bus;
   a plurality of secondary port controllers each operative to transfer traffic to and from a respective local bus; and
   a crossbar switch coupled to said primary port controller and to said secondary port controllers, said crossbar switch operative to selectively transfer traffic from each one of said primary and secondary port controllers to any other one of said primary and secondary port controllers; wherein:
      said primary port controller has a bus width wider than at least one of said secondary port controllers.

6. The bus switch of claim 5 wherein said primary port controller has a bus width of about 64 bits and at least one of said secondary port controllers has a bus width of about 32 bits.

7. A computer-system bus switch comprising:
   a primary port controller operative to transfer traffic to and from a main system bus;
   a plurality of secondary port controllers each operative to transfer traffic to and from a respective local bus; and
   a crossbar switch coupled to said primary port controller and to said secondary port controllers, said crossbar switch operative to selectively transfer traffic from each one of said primary and secondary port controllers to any other one of said primary and secondary port controllers; wherein said primary port controller comprises:
      a first queue operative to store traffic received from said crossbar switch; and
      a second queue operative to store traffic received from said main system bus.

8. A computer-system bus switch comprising:
   a primary port controller operative to transfer traffic to and from a main system bus;
   a plurality of secondary port controllers each operative to transfer traffic to and from a respective local bus; and
   a crossbar switch coupled to said primary port controller and to said secondary port controllers, said crossbar switch operative to selectively transfer traffic from each one of said primary and secondary port controllers to any other one of said primary and secondary port controllers; wherein each of said secondary port controllers comprises:
      a first queue operative to store traffic received from said crossbar switch; and
      at least two other queues each operative to store traffic received from a local bus.

9. The bus switch of claim 8 wherein:
   one of said two other queues stores traffic destined for said primary port controller; and
   another of said two other queues stores traffic destined for another of said secondary port controllers.

10. A computer-system bus switch comprising:
    a primary port controller operative to transfer traffic to and from a main system bus;
    a plurality of secondary port controllers each operative to transfer traffic to and from a respective local bus; and
    a crossbar switch coupled to said primary port controller and to said secondary port controllers, said crossbar switch operative to selectively transfer traffic from each one of said primary and secondary port controllers to any other one of said primary and secondary port controllers; wherein said crossbar switch comprises:
       an array of multiplexers operative to selectively connect any one of said primary and secondary port controllers to any other one of said primary and secondary port controllers; and
       an arbiter coupled to said array of multiplexers, said arbiter operative to control connections made by said array and to resolve competing requests for connections to one of said primary and secondary port controllers, said requests received from other said primary and secondary port controllers.

11. A circuit board comprising a computer-system bus switch and a system controller mounted thereon, said system controller coupled to said bus switch, said bus switch comprising:
    a primary port controller operative to transfer traffic to and from a main system bus;
    a plurality of secondary port controllers each operative to transfer traffic to and from a respective local bus; and
    a crossbar switch coupled to said primary port controller and to said secondary port controllers, said crossbar switch operative to selectively transfer traffic from each one of said primary and secondary port controllers to any other one of said primary and secondary port controllers.

12. The circuit board of claim 11 wherein said bus switch is implemented as a programmable logic device.

13. The circuit board of claim 11 further comprising a central processing unit mounted thereon and coupled to said bus switch.

14. A data processing system comprising:
    a plurality of peripheral devices; and
    the circuit board of claim 11 coupled to said peripheral devices.

15. A method of transferring data-processing traffic between an initiator device and a target device through a bus switch, said bus switch comprising a plurality of port controllers each coupled to at least one device, said initiator device coupled to a first of said port controllers and said target device coupled to a second of said port controllers, said bus switch further comprising a crossbar switch coupled to each of said port controllers and operative to selectively transfer traffic from each one of said port controllers to any other one of said port controllers, said method comprising:

receiving at said first port controller a request to transfer traffic between said initiator device and said target device;

storing traffic received from said initiator device into a queue of said first port controller;

instructing said crossbar switch to connect said first port controller to said second port controller, said second port controller being any other one of said port controllers;

transferring said traffic from said first port controller queue to a queue of said second port controller; and transferring said traffic from said second port controller queue to said target device.

16. The method of claim 15 wherein said receiving comprises decoding said received request to identify said second port controller.

17. The method of claim 15 wherein said instructing comprises arbitrating multiple requests to connect to said second port controller, said multiple requests received from a respective multiple of said port controllers.

18. The method of claim 17 wherein said arbitrating is based on a rotating port controller priority scheme.

19. The method of claim 15 further comprising after said storing and before said transferring said traffic from said first port controller queue:

awaiting said stored traffic to reach top of said first port controller queue.

20. The method of claim 15 further comprising comparing an address received in said traffic from said first port controller to an address stored in a register of said second port controller to determine whether an earlier traffic transfer is being completed.

21. The method of claim 15 further comprising complying with Peripheral Component Interconnect standards.

22. A computer-system bus switch comprising:

a primary port controller operative to transfer traffic to and from a main system bus;

a plurality of secondary port controllers each operative to transfer traffic to and from a respective local bus; and a crossbar switch coupled to said primary port controller and to said secondary port controllers, said crossbar switch operative to selectively transfer traffic from each one of said primary and secondary port controllers to any other one of said primary and secondary port controllers, said crossbar switch comprising an array of multiplexers and an arbiter coupled to said array, said crossbar switch further operative to transfer traffic from said primary port controller to a first said secondary port controller while transferring traffic concurrently from a second said secondary port controller to a third said secondary port controller.

23. A computer-system bus switch comprising:

a primary port controller operative to transfer traffic to and from a main system bus;

a plurality of secondary port controllers each operative to transfer traffic to and from a respective local bus; and a crossbar switch coupled to said primary port controller and to said secondary port controllers, said crossbar switch operative to selectively transfer traffic from each one of said primary and secondary port controllers to any other one of said primary and secondary port controllers; wherein:

at least one of said primary and secondary port controllers comprises first and second queues operative to store traffic, said at least one port controller operative to concurrently send and receive traffic via said crossbar switch.

24. A computer-system bus switch comprising:

a primary port controller operative to transfer traffic to and from a main system bus;

a plurality of secondary port controllers each operative to transfer traffic to and from a respective local bus; and a crossbar switch coupled to said primary port controller and to said secondary port controllers, said crossbar switch operative to selectively transfer traffic from each one of said primary and secondary port controllers to any other one of said primary and secondary port controllers, said crossbar switch comprising an array of multiplexers and an arbiter coupled to said array, the number of multiplexers in said array equaling the number of said primary and secondary port controllers, at least one of said primary and secondary port controllers being operative to send traffic directly to itself via said crossbar switch.

25. A computer-system bus switch comprising:

a primary port controller operative to transfer traffic to and from a main system bus;

a plurality of secondary port controllers each operative to transfer traffic to and from a respective local bus; and a crossbar switch coupled to said primary port controller and to said secondary port controllers, said crossbar switch operative to selectively transfer traffic from each one of said primary and secondary port controllers to any other one of said primary and secondary port controllers; wherein:

at least one of said primary and secondary port controllers comprises first and second queues operative to store traffic, at least one of said secondary port controllers being operative to send traffic via said crossbar switch concurrently to said primary port controller and another of said secondary port controllers.

26. A method of transferring data-processing traffic through a bus switch, said bus switch comprising a plurality of port controllers and a crossbar switch coupled to each of said port controllers, said crossbar switch comprising an array of multiplexers and an arbiter coupled to said array, said method comprising:

transferring traffic from a first one of said port controllers through said array of said crossbar switch to a second one of said port controllers; and transferring traffic from a third one of said port controllers through said array of said crossbar switch to a fourth one of said port controllers concurrently as said transferring traffic from said first to said second port controllers.

27. A method of transferring data-processing traffic through a bus switch, said bus switch comprising a plurality of port controllers and a crossbar switch coupled to each of said port controllers, said crossbar switch comprising an array of multiplexers and an arbiter coupled to said array, said method comprising:

transferring traffic from a first one of said port controllers through said array of said crossbar switch to a second one of said port controllers; and transferring said traffic from said first port controller through said array of said crossbar switch to a third one of said port controllers concurrently as said transferring traffic from said first to said second port controllers.

* * * * *